US012671445B2

(12) United States Patent
Lenhart et al.

(10) Patent No.: US 12,671,445 B2
(45) Date of Patent: Jun. 30, 2026

(54) DIFFERENTIAL DUPLEXER SYSTEMS WITH PHASE SHIFTERS

(71) Applicant: Apple Inc., Cupertino, CA (US)

(72) Inventors: Bjoern Lenhart, Nuremberg (DE);
Christof Pfannenmüller, Erlangen
(DE); Dominic Koehler,
Viereth-Trunstadt (DE); Harald Pretl,
Schwertberg (AT); Rastislav Vazny,
Sunnyvale, CA (US)

(73) Assignee: Apple Inc., Cupertino, CA (US)

( * ) Notice: Subject to any disclaimer, the term of this
patent is extended or adjusted under 35
U.S.C. 154(b) by 684 days.

(21) Appl. No.: 17/945,023

(22) Filed: Sep. 14, 2022

(65) Prior Publication Data

US 2024/0088921 A1     Mar. 14, 2024

(51) Int. Cl.
H04B 1/00          (2006.01)
H03H 9/70          (2006.01)
               (Continued)

(52) U.S. Cl.
CPC ........... H04B 1/0057 (2013.01); H03H 9/706
(2013.01); H03H 9/725 (2013.01); H04B 1/04
(2013.01); H04B 1/10 (2013.01)

(58) Field of Classification Search
CPC .... H04B 1/005; H04B 1/0053; H04B 1/0057;
H04B 1/006; H04B 1/04; H04B 1/10;
H04B 1/38; H04B 1/40; H04B 1/44;
H04B 1/48; H04B 1/50; H04B 1/525;
H04B 1/581; H04B 3/03; H04B 3/56;
H04L 5/0001; H04L 5/14; H04L 5/1415;
H04L 5/16;
(Continued)

(56) References Cited

U.S. PATENT DOCUMENTS

2013/0114470 A1 *   5/2013   Lee .......................... H04B 1/525
                                                         370/278
2013/0176912 A1 *   7/2013   Khlat ..................... H04B 1/525
                                                         370/277
(Continued)

FOREIGN PATENT DOCUMENTS

WO       WO-2022058613 A1 *   3/2022   ........... H04B 1/0057

*Primary Examiner* — Young T. Tse

(74) *Attorney, Agent, or Firm* — FLETCHER YODER PC

(57) ABSTRACT

A communication device includes a duplexer differentially
coupled to a receiver and a transmitter. The duplexer may
include phase shifters on the differential lines to provide
differential received signals to the receiver and receive
differential transmission signals from the transmitter for
transmission. For example, the phase shifter are positioned
such that single-ended received signals may be converted to
differential received signals and convert the differential
transmission signals to single-ended transmission signals for
transmission. Moreover, the phase shifters may provide the
single-ended transmission signals to antennas for transmis-
sion and to the differential lines of the receiver for cancel-
lation/isolation. Furthermore, the phase shifters may provide
the differential received signals to the receiver for reception
and provide the single-ended received signals to the differ-
ential lines of the transmitter for cancellation/isolation.
Accordingly, the duplexer may convey communication sig-
nal while reducing signal interference by providing
improved isolation.

20 Claims, 13 Drawing Sheets

(51) Int. Cl.
    *H03H 9/72* (2006.01)
    *H04B 1/04* (2006.01)
    *H04B 1/10* (2006.01)

(58) Field of Classification Search
    CPC . H04L 5/26; H03H 9/66; H03H 9/706; H03H
    9/725
    USPC ....... 375/219, 220, 257–260, 267, 269, 273,
    375/279–281; 370/278, 282, 284;
    398/41, 42; 455/42, 60, 73, 78, 82, 83
    See application file for complete search history.

(56) References Cited

U.S. PATENT DOCUMENTS

| 2015/0016313 | A1* | 1/2015 | Khlat ........................ | H04L 5/14 |
| | | | | 370/280 |
| 2016/0182006 | A1* | 6/2016 | Larson .................... | H03H 7/21 |
| | | | | 333/132 |
| 2022/0038122 | A1* | 2/2022 | Hur ........................ | H03F 1/0288 |
| 2022/0078059 | A1* | 3/2022 | Dorn ........................ | H04B 1/48 |
| 2022/0329273 | A1* | 10/2022 | Pehlke ................... | H03H 9/725 |

* cited by examiner

DIFFERENTIAL DUPLEXER SYSTEMS WITH PHASE SHIFTERS

BACKGROUND

The present disclosure relates generally to wireless communication, and more specifically to isolation of wireless signals between transmitters and receivers in wireless communication devices.

In an electronic device, a transmitter and a receiver may each be coupled to one or more antennas to enable the electronic device to both transmit and receive wireless signals. The electronic device may include a duplexer that isolates the transmitter from received signals of a first frequency range, and isolates the receiver from transmission signals of a second frequency range (e.g., thus implementing frequency division duplex (FDD) operations). In this manner, interference between the transmission and received signals may be reduced when communicating using the electronic device. However, these communications may be negatively impacted by insertion loss resulting from components of the duplexer providing less than ideal isolation of the transmission and/or received signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a radio frequency front end (RFFE) circuit is described. The RFFE circuit may include a first phase shifter coupled to a node, where the node may be coupled to one or more antennas. The RFFE circuit may also include a receiver differentially coupled to the first phase shifter and the node, a second phase shifter coupled to the node, and a transmitter differentially coupled to the second phase shifter and the node.

In another embodiment, a duplexer is described. The duplexer may include a node that may be coupled to one or more antennas, a receiver phase shifter coupled to the node, and a transmitter phase shifter coupled to the node. The receiver phase shifter may be coupled to a first terminal of differential receiver circuitry. The transmitter phase shifter may be coupled to a first terminal of differential transmitter circuitry. Moreover, the node may couple to a second terminal of the differential receiver circuitry and a second terminal of the differential transmitter circuitry.

In yet another embodiment, an electronic device is described. The electronic device may include a radio frequency (RF) receiver, a first balun coupled to the RF receiver, an RF transmitter, a second balun coupled to the RF transmitter, and a duplexer coupled to one or more antennas. The duplexer may be differentially coupled to the RF receiver via the first balun and differentially coupled to the RF transmitter via the second balun.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figures 1, 2:
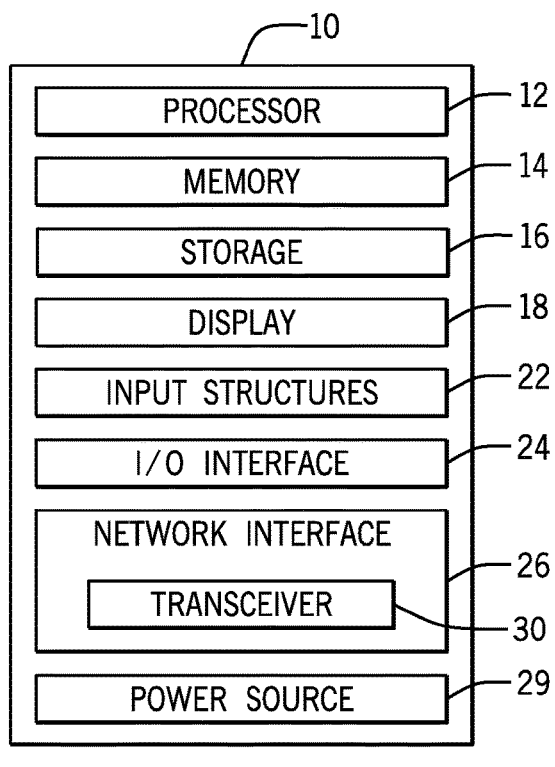
FIG. 1 is a block diagram of an electronic device, according to embodiments of the present disclosure.
FIG. 2 is a functional diagram of the electronic device of FIG. 1, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to radio frequency front end (RFFE) circuits with improved isolation between received (RX) signals and transmission (TX) signals and/or improved insertion loss (e.g., loss resulting from the components of the duplexer providing less than ideal isolation of the transmission and/or received signals) of reception circuitry and transmission circuitry. For example, an electronic device may include an RFFE and one or more antennas, among other things. The electronic device may communicate radio frequency (RF) signals via the RFFE and the antennas. The RFFE may include a receiver, a transmitter, and a duplexer (e.g., a circular balanced duplexer (CBD), or any other duplexer used to isolate wireless signals between transmitters and receivers). The receiver and the transmitter may be coupled to the antennas via the duplexer.

The receiver, the transmitter, and the duplexer may be coupled by differential connections. In some embodiments, the receiver and/or the transmitter may couple to the duplexer via one or more baluns to provide and/or receive differential signals. Moreover, the duplexer and the antennas may be coupled by a single-ended connection. The duplexer may include circuitry to convey differential TX signals provided by the transmitter as single-ended TX signals to the antennas for transmission, convey single-ended RX signals received by the antennas as differential RX signals to the receiver, and provide isolation between the receiver and the TX signals, and/or the transmitter and the RX signals.

In some embodiments, the duplexer may include a number of phase shifters to provide the single-ended TX signals to the antennas and the differential RX signals to the receiver. For example, each phase shifter may shift a component of received differential signals to provide single-ended signals and delay a component (e.g., an instance) of received single-ended signals to provide differential signals. Moreover, the phase shifters may shift a phase of signals having different frequencies by different values. For example, a RX phase shifter may shift a phase of a first component of single-ended RX signals to provide differential RX signals to the receiver while shorting signals outside a RX frequency range (e.g., the TX signals). Moreover, a TX phase shifter may shift a phase of a first component of differential TX signals to provide single-ended TX signals to the antennas while shorting signals outside a TX frequency range (e.g., the RX signals). For example, each phase shifter may include a band-pass filter, a high-pass filter, or a low-pass filter.

In particular, the RX phase shifter may provide half a wavelength phase delay (e.g., 180° phase shift, approximately 180° phase shift) to signals within a RX frequency range to provide the differential RX signals to the receiver. Similarly, the TX phase shifter may provide 180° phase shift to signals within a TX frequency range to provide the single-ended TX signals to the antennas for transmission. In some embodiments, the duplexer may include multiple RX phase shifters and/or TX phase shifters coupled in series. In such embodiments, each phase shifter may provide a portion of the 180° phase shift to provide the differential RX signals and/or the single-ended TX signals. Moreover, in some cases, the duplexer may be tunable. For example, the tunable duplexer may include switches between the phase shifters and/or adjustable/tunable components to alter isolation performance and the insertion loss between the transmitter, the receiver, and/or the antennas.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mm-Wave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

FIG. 2 is a functional diagram of the electronic device 10 of FIG. 1, according to embodiments of the present disclosure. As illustrated, the processor 12, the memory 14, a radio frequency front end (RFFE) 50 having the transceiver 30, which includes a transmitter 52 and a receiver 53, and duplexer 54 (e.g., isolation circuitry), and/or one or more antennas 55 (illustrated as 55A-55N, referred to as antennas 55) may be communicatively coupled directly or indirectly (e.g., through or via another component, a communication bus, a network) to one another to transmit and/or receive signals between one another.

The transmitter 52 and/or the receiver 53 may respectively enable transmission and reception of signals between the electronic device 10 and an external device via, for example, a network (e.g., including base stations or access points) or a direct connection. As illustrated, the transmitter 52 and the receiver 53 may be combined into the transceiver 30. The electronic device 10 may also have the antennas 55 electrically coupled to the transceiver 30 via the duplexer 54. The antennas 55 may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55 of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 53 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

As illustrated, the duplexer 54 is communicatively coupled between the transmitter 52 and the receiver 53, as well as one or more of the antennas 55. The duplexer 54 enables signals (e.g., transmission (TX) signals) of a first frequency range to pass through from the transmitter 52 to the antennas 55 and blocks the signals of the first frequency range from passing through to the receiver 53. The duplexer 54 also enables signals (e.g., received (RX) signals) of a second frequency range received via the antennas 55 to pass through to the receiver 53 and blocks the signals of the second frequency range from passing through to the transmitter 52. Each frequency range may be of any suitable bandwidth, such as between 0 and 100 gigahertz (GHz) (e.g., 10 megahertz (MHz)), and include any suitable frequencies. For example, the first frequency range (e.g., a transmit frequency range) may be between 880 and 890 MHz, and the second frequency range (e.g., a receive frequency range) may be between 925 and 936 MHz.

Figures 3, 4, 5:
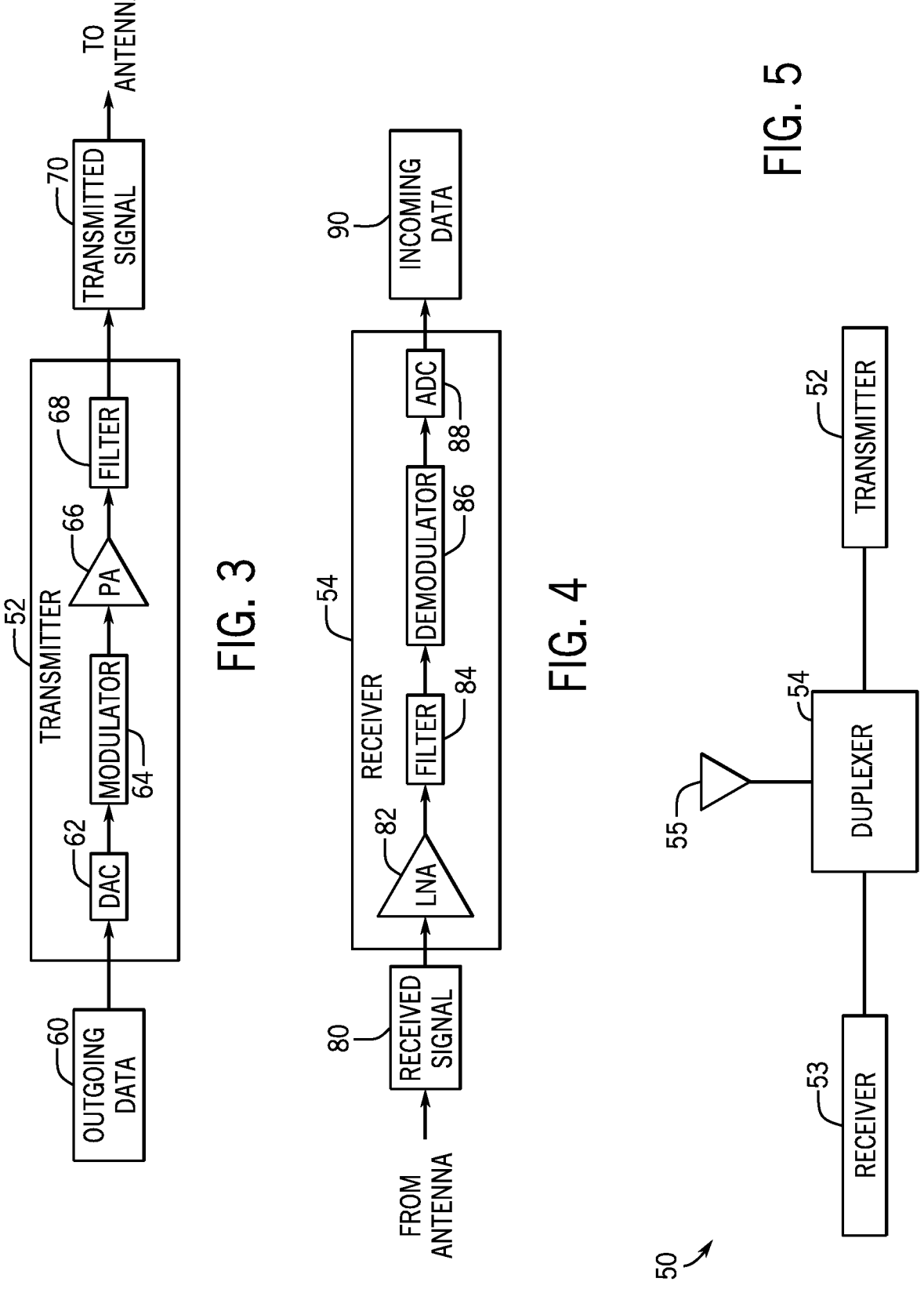
FIG. 3 is a schematic diagram of a transmitter of the electronic device of FIG. 1, according to embodiments of the present disclosure.
FIG. 4 is a schematic diagram of a receiver of the electronic device of FIG. 1, according to embodiments of the present disclosure.
FIG. 5 is a schematic diagram of a radio frequency front end (RFFE) of the electronic device of FIG. 1 having a duplexer, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE) 69, and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

FIG. 4 is a schematic diagram of the receiver 53 (e.g., receive circuitry), according to embodiments of the present disclosure. As illustrated, the receiver 53 may receive received signal 80 from the one or more antennas 55 in the form of an analog signal. A low noise amplifier (LNA) 82 may amplify the received analog signal to a suitable level for the receiver 53 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE 69, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 53 may include any suitable additional components not shown, or may not include certain of the illustrated components, such that the receiver 53 may receive the received signal 80 via the one or more antennas 55. For example, the receiver 53 may include a mixer and/or a digital down converter.

FIG. 5 is a schematic diagram of the RFFE 50 of the electronic device 10, according to embodiments of the present disclosure. As described above, the RFFE 50 includes the duplexer 54 that isolates the transmitter 52 from received signals of a first frequency range, and isolates the receiver 53 from transmission signals of a second frequency range. Due to a non-ideal nature of components of the duplexer 54, when isolating the receiver 53 from the TX signals generated by the transmitter 52, some of the TX signals (e.g., a TX leakage signal) may propagate toward the receiver 53. If a frequency of the TX leakage signal is within the receive frequency range (e.g., is a frequency supported by the receiver 53), the transmit leakage signal may interfere with RX signals (e.g., single-ended RX signal) and/or the receiver 53. Similarly, when isolating the transmitter 52 from RX signals received via the antennas 55, some of the RX signals (e.g., a RX leakage signal) may propagate toward the transmitter 52. If a frequency of the RX leakage signal is within the transmit frequency range (e.g., is a frequency supported by the transmitter 52), the RX leakage signal may interfere with the TX signals and/or the transmitter 52. These leakage signals may be referred to as insertion loss.

Figure 6:
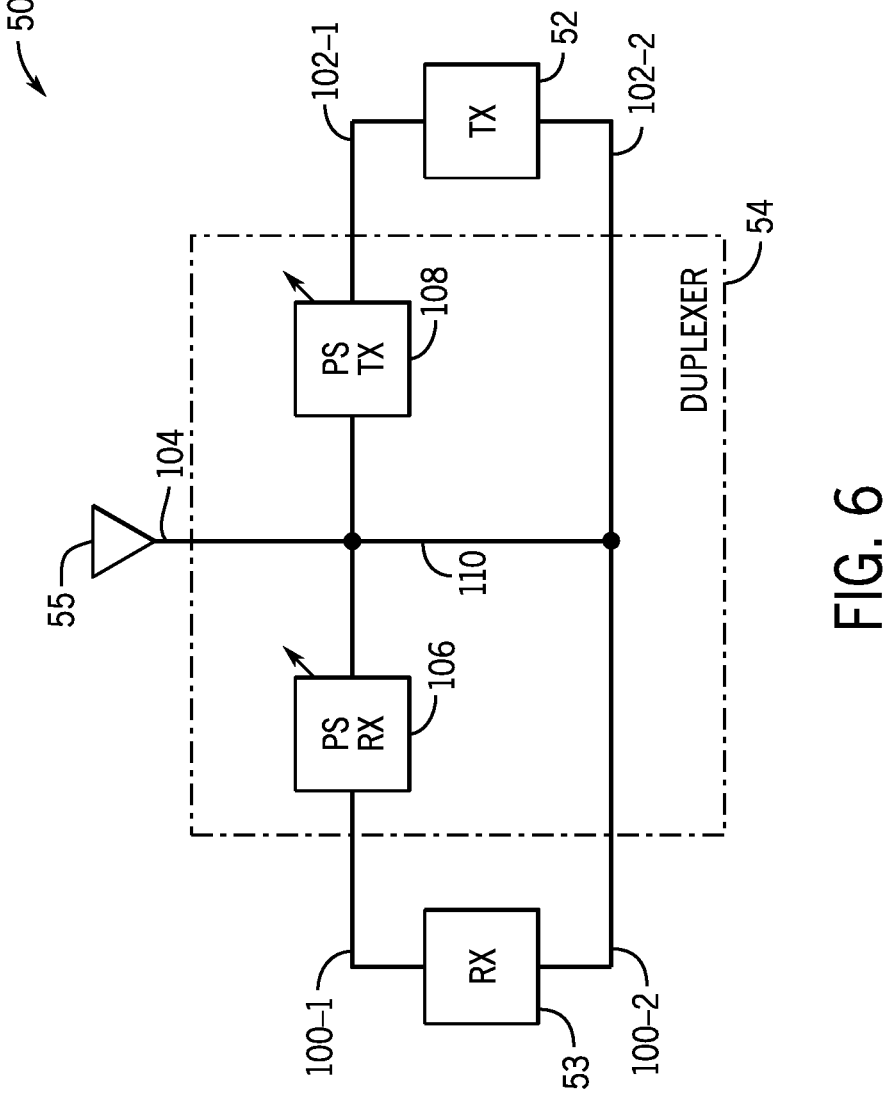
FIG. 6 is a circuit diagram of the RFFE of FIG. 5 where the duplexer is differentially coupled to the receiver and the transmitter, according to embodiments of the present disclosure.

FIG. 6 is a circuit diagram of the RFFE 50 where the duplexer 54 is coupled to the receiver 53 via differential lines 100-1 and 100-2, to the transmitter 52 via differential lines 102-1, and 102-2, and to the antennas 55 via single-ended line 104. Each of the lines 100-1, 100-2, 102-1, and 102-2 may include one or more conductive paths. As mentioned above, the duplexer 54 may include circuitry to provide single-ended TX signals to the antennas 55 and differential RX signals to the receiver 53. In the depicted embodiment, the duplexer 54 may include a RX phase shifter (PS) 106 disposed on (e.g., coupled in series with) the differential line 100-1, a TX phase shifter 108 disposed on (e.g., coupled in series with) a differential line 102-1 of the differential lines 102. Moreover, the duplexer 54 may include a node 110 coupled to the RX phase shifter 106, the TX phase shifter 108, and the antennas 55. The node 110 is also coupled to the RX phase shifter 106 and the TX phase shifter 108. Furthermore, in specific cases, the RX phase shifter 106, the TX phase shifter, or both may include a bandpass filter, a high-pass filter, a low-pass filter, or a combination thereof.

In some embodiments, the RX phase shifter 106 may include circuitry to shift a phase of input signals having a RX frequency within the receive frequency range by half a wavelength (e.g., by 180° or near 180°). Accordingly, the duplexer 54 may use the RX phase shifter 106 to generate the differential RX signals on the differential lines 100 for reception by the receiver 53 based on receiving a single-ended RX signal provided by the antennas 55. In different embodiments, the receiver 53 may be coupled to the differential lines 100 via a converter (e.g., a transformer, a balun, among other things) and/or may include circuitry to receive the differential RX signals.

The RX phase shifter 106 may also short input signals having the TX frequency. That is, the RX phase shifter 106 may convey the input signals having the TX frequency with no delay or with minimum delay (e.g., no phase change, relatively small phase change). Accordingly, in some embodiments, the duplexer 54 may use the RX phase shifter 106 to cancel TX leakage signals at the receiver 53.

Moreover, the TX phase shifter 108 may include circuitry to shift a phase of input signals having a TX frequency within the transmit frequency range by half a wavelength (e.g., by 180° or near 180°). As such, the duplexer 54 may use the TX phase shifter 108 to generate the single-ended TX signals on the single-ended line 104 for transmission by the antennas 55 based on receiving differential TX signals provided by the transmitter 52. In different embodiments, the transmitter 52 may be coupled to the differential lines 102 via a converter (e.g., a transformer, a balun, among other things) and/or may include circuitry to receive the differential RX signals.

The TX phase shifter 108 may also short input signals having the RX frequency. The TX phase shifter 108 may convey the input signals having the RX frequency with no delay or with minimum delay (e.g., no phase change, relatively small phase change). Accordingly, in some embodiments, the duplexer 54 may use the TX phase shifter 108 to cancel RX leakage signals at the transmitter 52.

Figure 7:
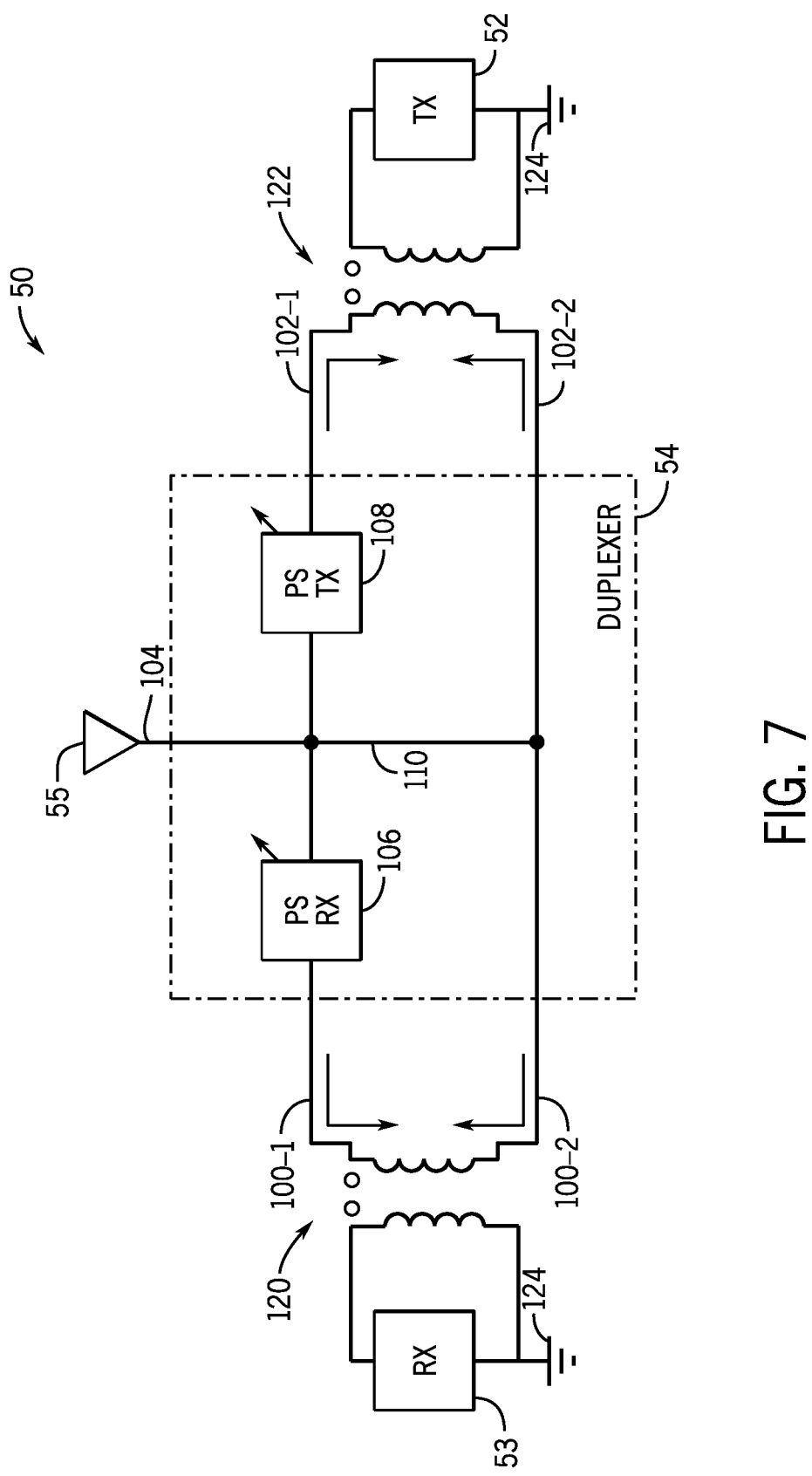
FIG. 7 is a circuit diagram of the RFFE of FIG. 6 where the duplexer is differentially coupled to the receiver and the transmitter via a first balun and a second balun respectively, according to embodiments of the present disclosure.

FIG. 7 is the circuit diagram of the RFFE 50 where the duplexer 54 is differentially coupled to the receiver 53 and the transmitter 52 via a first balun 120 and a second balun 122 respectively. It should be appreciated that the first balun 120 and the second balun 122 are depicted by the way example and the duplexer 54 may differentially couple to the receiver 53 and/or the transmitter 52 using any viable circuitry. As used herein, differentially coupled may mean coupling of components (e.g., the duplexer 54 with the receiver 53 and/or the transmitter 52) via two conductive paths such that complementary (e.g., out-of-phase signals) TX signals and/or RX signals may be conveyed. In some cases, such conductive paths may also convey single-ended TX signals and/or RX signals. For example, in alternative or additional embodiments, the receiver 53 and/or the transmitter 52 may include the first balun 120 and the second balun respectively and/or include other different circuitry to receive and provide differential signals.

In any case, in the depicted embodiment, the duplexer 54 is coupled to the antennas 55, a first side of the first balun 120, and a first side of the second balun 122. The receiver 53 is coupled to a ground connection 124 and a second side of the first balun 120. Moreover, the transmitter 52 is coupled to the ground connection 124 and a second side of the second balun 122. The receiver 53 may include circuitry to receive a single-ended signal and the transmitter 52 may include circuitry to provide a single-ended signal for transmission.

The first balun 120 and the second balun 122 may each convert between a differential signal on the first side and a single-ended signal on the second side. Moreover, the first balun 120 and the second balun 122 may each destructively combine in-phase signals (e.g., signals with relatively near or equal phases) on the first side. The first balun 120 may provide a single-ended signal to the receiver when receiving differential signals provided by the duplexer 54 on the first side. The first balun 120 may destructively combine (e.g., cancel) in-phase signals provided by the duplexer 54 on the first side. Moreover, the second balun 122 may provide differential signals to the duplexer 54 when receiving a single-ended signal provided by the transmitter 52. Similarly, the second balun 122 may destructively combine (e.g., cancel) in-phase signals provided by the duplexer 54 on the first side.

Figure 8:
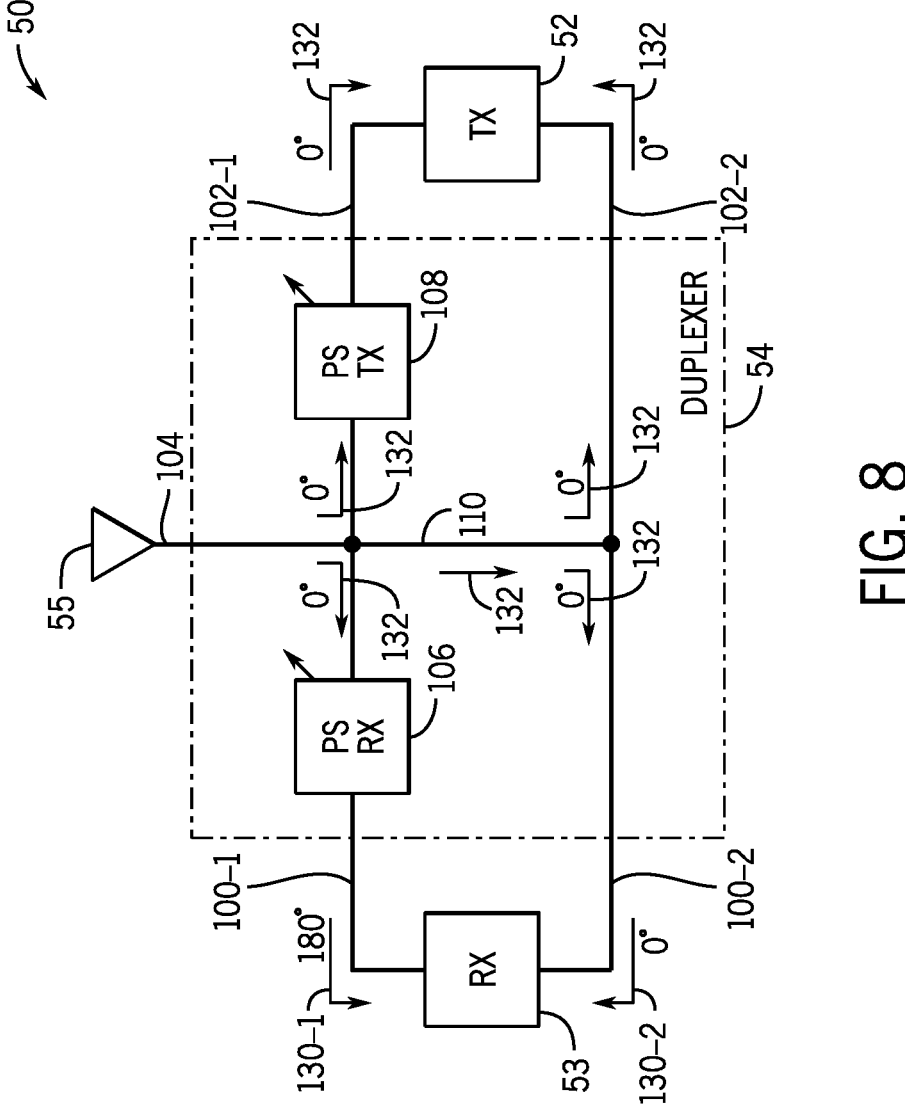
FIG. 8 is the circuit diagram of the RFFE of FIG. 6 where the duplexer generates differential RX signals based on receiving single-ended RX signals from the antennas, according to embodiments of the present disclosure.

FIG. 8 is the circuit diagram of the RFFE 50 where the duplexer 54 generates differential RX signals 130 based on receiving single-ended RX signals 132 from the antennas 55. The differential RX signals 130 may include the single-ended RX signals 132 (e.g., at least a portion of the single-ended RX signals 132) having a first phase on the first differential line 100-1 and having a second phase on the second differential line 100-2. The antennas 55 may provide the single-ended RX signals 132 to the first differential line 100-1 via the node 110 and the RX phase shifter 106 and to the second differential line 100-2 via the node 110. Moreover, the RX phase shifter 106 may shift the phase of the single-ended RX signals 132 to provide the single-ended RX signals 132 with the first phase. As such, the duplexer 54 may provide the differential RX signals 130 to the receiver 53 based on receiving the single-ended RX signals 132 from the antennas 55. Accordingly, the receiver 53 may input the differential RX signals 130. In some embodiments, the receiver 53 may include and/or may be coupled to the first balun 120 described above to input the differential RX signals 130.

Moreover, the duplexer 54 may provide a pair of the single-ended RX signals 132 (e.g., at least a portion of the single-ended RX signals 132) to the transmitter 52 via the first line 132-1 and the second line 132-2. The antennas 55 may provide the single-ended RX signals 132 to the first differential line 102-1 via the node 110 and the TX phase shifter 108 and to the second differential line 102-2 via the node 110. As discussed above, the TX phase shifter 108 may convey the single-ended RX signals 132 having the RX frequency within the receive frequency range with no delay or with minimum delay (e.g., no phase change, relatively small phase change).

As such, the duplexer 54 may provide the single-ended RX signals 132 to the transmitter 52 via the differential line 102-1 and the differential line 102-2. Moreover, the transmitter 52 may destructively combine the in-phase single-ended RX signals 132 of the differential lines 102. In some embodiments, the transmitter 52 may include and/or may be coupled to the second balun 122 described above. Accordingly, the duplexer 54 may reduce leakage of the RX signals 132 (or the single-ended RX signals 132) to the transmitter 52 to improve isolation of the RFFE 50.

Figure 9:
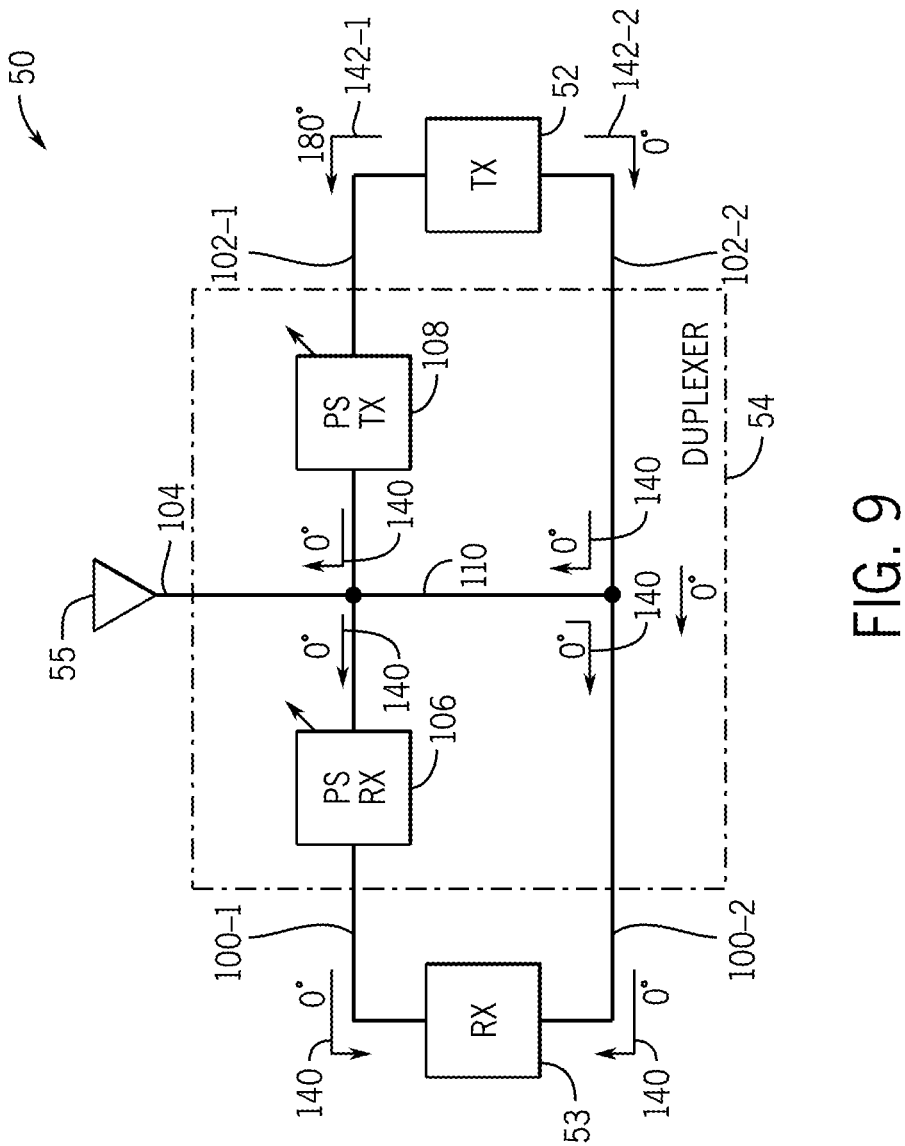
FIG. 9 is the circuit diagram of the RFFE of FIG. 6 where the duplexer generates single-ended TX signals based on receiving differential TX signals from the transmitter, according to embodiments of the present disclosure.

FIG. 9 is the circuit diagram of the RFFE 50 where the duplexer 54 generates single-ended TX signals 140 based on receiving differential TX signals 142 from the transmitter 52. The differential TX signals 142 may include a first signal having a first phase on the first differential line 102-1 and a second signal having a second phase on the second differential line 102-2. The TX phase shifter 108 may shift (e.g., delay) the phase of the first signal having the first phase to provide the first signal and the second signal of the differential TX signals 142 with the second phase. As such, the duplexer 54 may combine the differential TX signals 142 at the node 110. Accordingly, the duplexer 54 may provide the single-ended TX signals 140 to the antennas 55 for transmission based on receiving the differential TX signals 142 from the transmitter 52. In some embodiments, the transmitter 52 may include and/or may be coupled to the second balun 122 described above to output the differential TX signals 142.

Moreover, the duplexer 54 may provide a pair of single-ended TX signals 140 (e.g., at least a portion of the single-ended TX signals 140) to the receiver 53 via the differential line 100-1 and the differential line 100-2. The transmitter 52 may provide the single-ended TX signals 140 to the first differential line 100-1 via the TX phase shifter 108, the node 110, and the RX phase shifter 106. As discussed above, the RX phase shifter 106 may convey the single-ended TX signals 140 having the TX frequency within the transmit frequency range with no delay or with minimum delay (e.g., no phase change, relatively small phase change).

Furthermore, the transmitter 52 may provide the single-ended TX signals 140 to the second differential line 100-2 via the node 110. As such, the duplexer 54 may provide the single-ended RX signals 132 to the receiver 53 via the differential line 100-1 and the differential line 100-2. Moreover, the receiver 53 may destructively combine the in-phase single-ended TX signals 140 of the differential lines 100. In some embodiments, the receiver 53 may include and/or may be coupled to the first balun 120 described above. Accordingly, the duplexer 54 may reduce leakage of the TX signals 140 (or the single-ended TX signals 140) to the receiver 53 to improve isolation of the RFFE 50.

With the foregoing in mind, in some cases, the RX phase shifter 106 and/or the TX phase shifter 108 may be non-ideal due to real-world characteristics of one or more components and/or process and implementation of the duplexer 54 and/or the RFFE 50. For example, the RX phase shifter 106 and/or the TX phase shifter 108 may provide a reduced phase shift (e.g., less than 180°) at frequencies higher or lower than a threshold (e.g., above 0.5 GHZ, above 1 GHz, above, 10 GHz, above 12 GHz, above 24 GHz, and so on). Accordingly, in some embodiments, the RFFE 50 may include additional circuitry for to improve the isolation between the transmitter 52 and the receiver 53.

Figure 10:
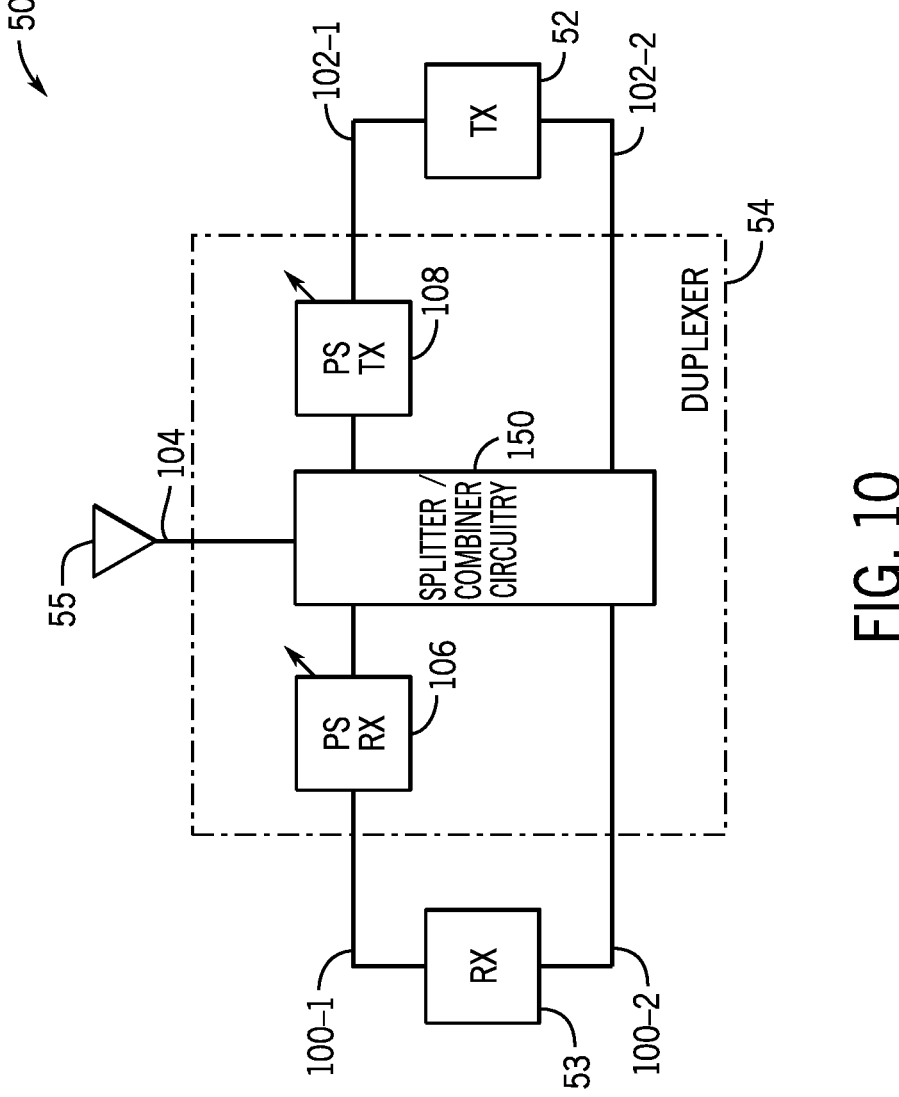
FIG. 10 is the circuit diagram of the RFFE of FIG. 6 where the duplexer includes splitter/combiner circuitry, according to embodiments of the present disclosure.

FIG. 10 is the circuit diagram of the RFFE 50 where the duplexer 54 includes splitter/combiner circuitry 150. For example, in different cases, each of the RX phase shifter 106, the TX phase shifter 108, the receiver 53, the transmitter 52, and the antennas 55 may have an impedance (e.g., input impedance and/or output impedance) similar or different from each other. Moreover, in some cases, the impedance of such components may constructively or destructively combine on the node 110 discussed above. As such, in some cases, each of the RX phase shifter 106, the TX phase shifter 108, the receiver 53, the transmitter 52, and the antennas 55 may receive a combined input or output impedance on the node 110. In such cases, one or more of the RX phase shifter 106, the TX phase shifter 108, the receiver 53, the transmitter 52, and the antennas 55 may receive an input or output impedance not being matched with an input or output impedance of one or more other components.

In the depicted embodiment, the duplexer may include the splitter/combiner circuitry 150 to match input or output impedances of each of the RX phase shifter 106, the TX phase shifter 108, the receiver 53, the transmitter 52, and the antennas 55 coupled thereto. In some embodiments, the splitter/combiner circuitry 150 may include a 1 to 4 divider circuit (e.g., 1:4 Wilkinson splitter/combiner circuit). In alternative or additional embodiments, the splitter/combiner circuitry 150 may include multiple splitter/combiner circuits as will be appreciated. In any case, the splitter/combiner circuitry 150 may include circuitry to provide a similar (e.g., substantially similar) impedance (e.g., 50Ω) to the RX phase shifter 106, the TX phase shifter 108, the receiver 53, the transmitter 52, and the antennas 55. In some cases, the splitter/combiner circuitry 150 may provide a complex conjugate impedance of the RX phase shifter 106, the TX phase shifter 108, the receiver 53, the transmitter 52, or the antennas 55 to the other components.

Figure 11:
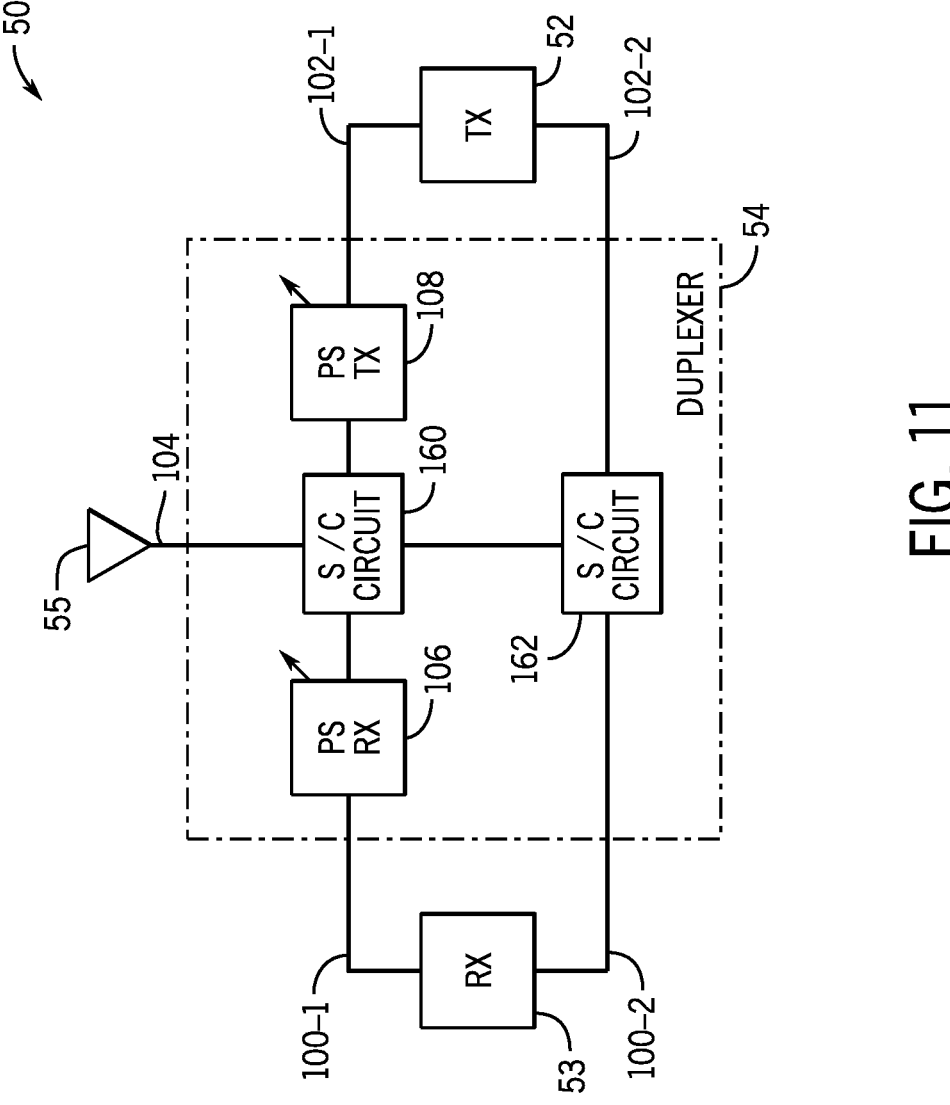
FIG. 11 is the circuit diagram of the RFFE of FIG. 10 where the splitter/combiner circuitry includes a first splitter/combiner circuit and a second splitter/combiner circuit, according to embodiments of the present disclosure.

FIG. 11 is the circuit diagram of the RFFE 50 where the duplexer 54 includes a first splitter/combiner circuit 160 and a second splitter/combiner circuit 162. In some cases, the splitter/combiner circuitry 150 of FIG. 10 described above may include the first splitter/combiner circuit 160 and the second splitter/combiner circuit 162. For example, the first splitter/combiner circuit 160 may include a 1 to 3 divider circuit (e.g., 1:3 Wilkinson splitter/combiner circuit) and the second splitter/combiner circuit 162 may include a 1 to 2 divider circuit (e.g., 1:2 Wilkinson splitter/combiner circuit). Similarly, the first splitter/combiner circuit 160 and the second splitter/combiner circuit 162 may include circuitry to provide a similar (e.g., substantially similar) impedance (e.g., 50Ω) to the RX phase shifter 106, the TX phase shifter 108, the receiver 53, the transmitter 52, and the antennas 55. Moreover, in some cases, the first splitter/combiner circuit 160 and/or the second splitter/combiner circuit 162 may provide a complex conjugate impedance of the RX phase shifter 106, the TX phase shifter 108, the receiver 53, the transmitter 52, or the antennas 55 to the other components.

Figure 12:
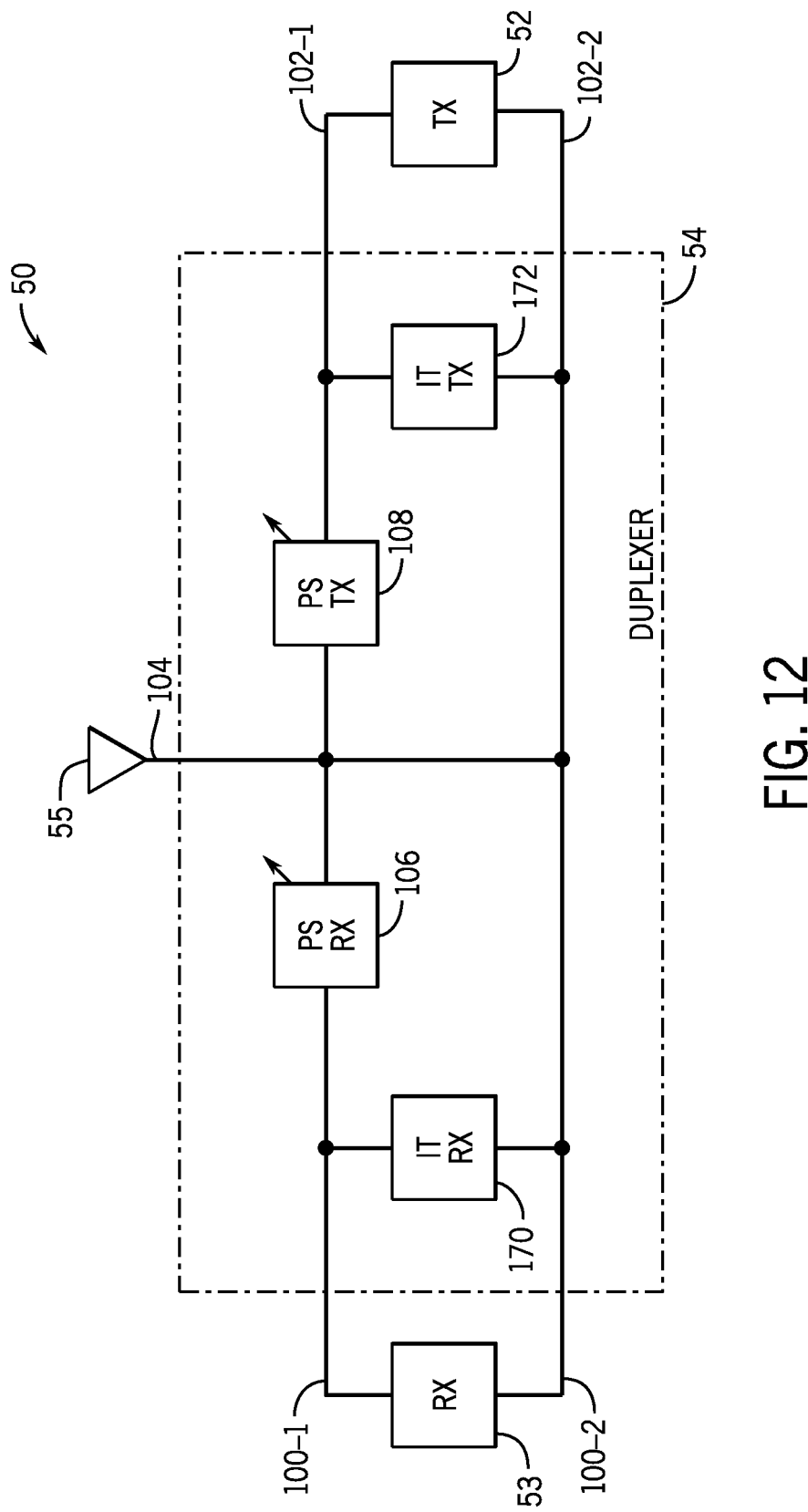
FIG. 12 is the circuit diagram of the RFFE of FIG. 6 where the duplexer includes a RX impedance tuner and a TX impedance tuner, according to embodiments of the present disclosure.

FIG. 12 is the circuit diagram of the RFFE 50 where the duplexer 54 includes a RX impedance tuner 170 and a TX impedance tuner 172. It should be appreciated that in alternative or additional embodiment the TX impedance tuner 172, the RX impedance tuner 170, or both may be positioned outside the duplexer in parallel to the receiver 53 and the transmitter 52 respectively. Moreover, it should be appreciate that in different embodiments, the TX impedance tuner 172 and the RX impedance tuner 170 may each include different circuitry.

The RX impedance tuner 170 may provide an impedance higher than a threshold (e.g., above 100Ω, above 200Ω, above 500Ω, and so on) to signals having a frequency within the receive frequency range. For example, the RX impedance tuner 170 may be open (or nearly open) to the single-ended RX signals 132 received from the antennas 55 described above with respect to FIG. 8. Moreover, the RX impedance tuner 170 may provide low impedance lower than a threshold (e.g., below 100Ω, below 10Ω, below 1Ω, and so on) to signals having a frequency within the transmit frequency range. In some embodiments, the RX impedance tuner 170 may short TX leakage signals. For example, the RX impedance tuner 170 may destructively combine and/or ground the single-ended TX signals 140 described above with respect to FIG. 9 and/or the TX leakage signals.

The TX impedance tuner 172 may provide high impedance higher than a threshold (e.g., above 100Ω, above 200Ω, above 500Ω, and so on) to signals having a frequency within the transmit frequency range. For example, the TX impedance tuner 172 may be open (or nearly open) to the single-ended TX signals 140 provided by the transmitter 52. Moreover, the TX impedance tuner 172 may provide low impedance lower than a threshold (e.g., below 100Ω, below 10Ω, below 1Ω, and so on) to signals having a frequency within the receive frequency range. In some embodiments, the TX impedance tuner 172 may short RX leakage signals. For example, the TX impedance tuner 172 may destructively combine and/or ground the single-ended RX signals 132 and/or the RX leakage signals. It should be appreciated that in different embodiments, the RX impedance tuner 170 and the TX impedance tuner 172 may provide similar or different impedances based on similar or different thresholds. In any case, the RX impedance tuner 170 and the TX impedance tuner 172 may improve isolation between the receiver 53 and the transmitter 52.

Figure 13:
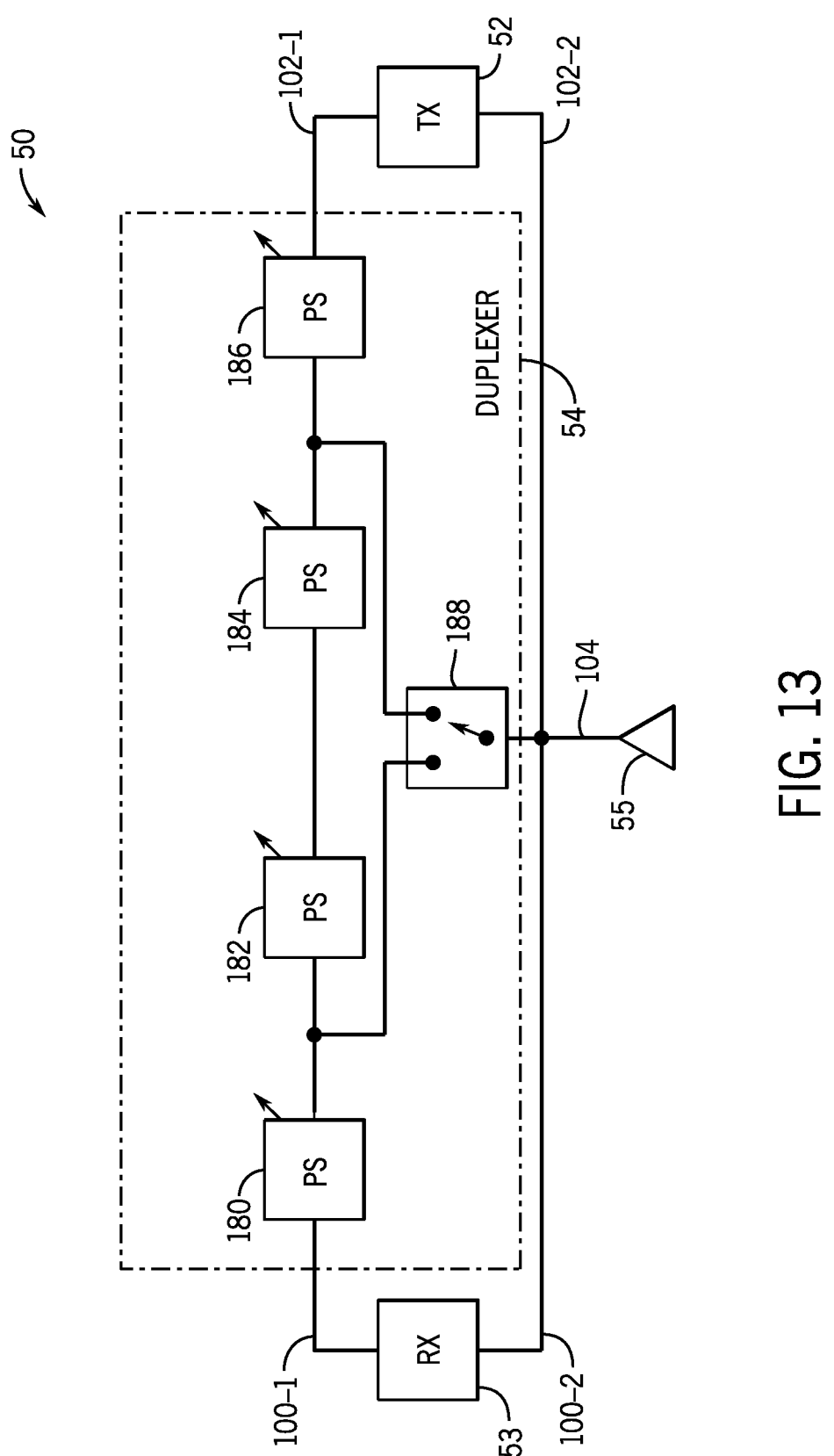
FIG. 13 is the circuit diagram of the RFFE of FIG. 6 where the duplexer includes multiple phase shifters configurable to operate with signals having different frequencies within multiple frequency ranges, according to embodiments of the present disclosure.

FIG. 13 is the circuit diagram of the RFFE 50 where the duplexer 54 includes multiple phase shifters 180, 182, 184, and 186 configurable to operate with signals having different frequencies within multiple frequency ranges. In the depicted embodiment, the phase shifters 180, 182, 184, and 186 are coupled in a first configuration or a second configuration. For example, one or more of the phase shifters 180, 182, 184, and 186 may provide different phase shifts to signals having frequencies in different frequency ranges. Moreover, the duplexer 54 may include a switch 188 to couple the phase shifters 180, 182, 184, and 186 in the first configuration or the second configuration. Accordingly, the duplexer 54 may use the phase shifters 180, 182, 184, and 186 to short and/or phase shift (e.g., by 180°) the RX signals 132 (and/or the differential RX signals 130) and the TX signals 140 (and/or the differential TX signals 142) at higher frequency ranges (e.g., above 1 GHz, above, 10 GHz, above 24 GHz, above 40 GHz, and so on) and/or to provide wider frequency ranges.

The switch 188 may receive one or more control signals to couple the phase shifters 180, 182, 184, and 186 in the first configuration or the second configuration. For example, the processor 12 of the electronic device 10 described above may provide the one or more control signals to the switch 188 based on referencing a lookup table stored on the memory 14 and/or the storage 16, a user input, beam configuration received from a base station, or a combination thereof, among other things. In the first configuration, the phase shifter 180 is coupled to (e.g., coupled directly or indirectly to) the differential line 100-1 between the antennas 55 and the receiver 53. Moreover, the phase shifter 182, 184, and 186 are coupled to (e.g., coupled directly or indirectly to) the differential line 102-1 between the antennas 55 and the transmitter 52. In the second configuration, the phase shifter 180, 182, and 184 are coupled to the differential line 100-1 between the antennas 55 and the receiver 53. Moreover, the phase shifter 186 is coupled to the differential line 102-1 between the antennas 55 and the transmitter 52.

In some embodiments, the duplexer 54 may pass-through (e.g., convey, pass-through with no phase change, pass-through with minimum phase change) the RX signals 132 having a frequency in a first receive frequency range with the first configuration of the phase shifters 180, 182, 184, and 186. Moreover, the duplexer 54 may convey the RX signals 132 having a frequency in a second receive frequency range with the second configuration of the phase shifters 180, 182, 184, and 186. Similarly, the duplexer 54 may convey the TX signals 140 having a frequency in a first transmit frequency range with the first configuration. The duplexer 54 may also convey the TX signals 140 having a frequency in a second transmit frequency range with the second configuration.

Moreover, each of the phase shifters 180, 182, 184, and 186 may provide a portion of the phase shift (e.g., by 180°) in the first configuration and/or the second configuration. For example, in the first configuration, the phase shifter 180 may provide half a wavelength phase shift to the single-ended RX signals 132 having a frequency within the first receive frequency range and the phase shifters 182, 184, and 186 may each provide a portion of (e.g., 25°, 30°, 48°, 60°, 90°, and so on) half a wavelength phase shift to the differential TX signals 142 having a frequency in the first transmit frequency range. Moreover, in the second configuration, the phase shifters 182, 184, and 186 may each provide a portion of (e.g., 25°, 30°, 48°, 60°, 90°, and so on) half a wavelength phase shift to the single ended RX signals 132 having a frequency in a second receive frequency range and the phase shifter 180 may provide half a wavelength phase shift to the differential TX signals 142 having a frequency in a first transmit frequency range. It should be appreciate that in alternative or additional cases, the duplexer 54 may include a different number of phase shifters and/or a different number of switches to operate with signals in multiple frequency ranges and band combinations.

Figure 14:
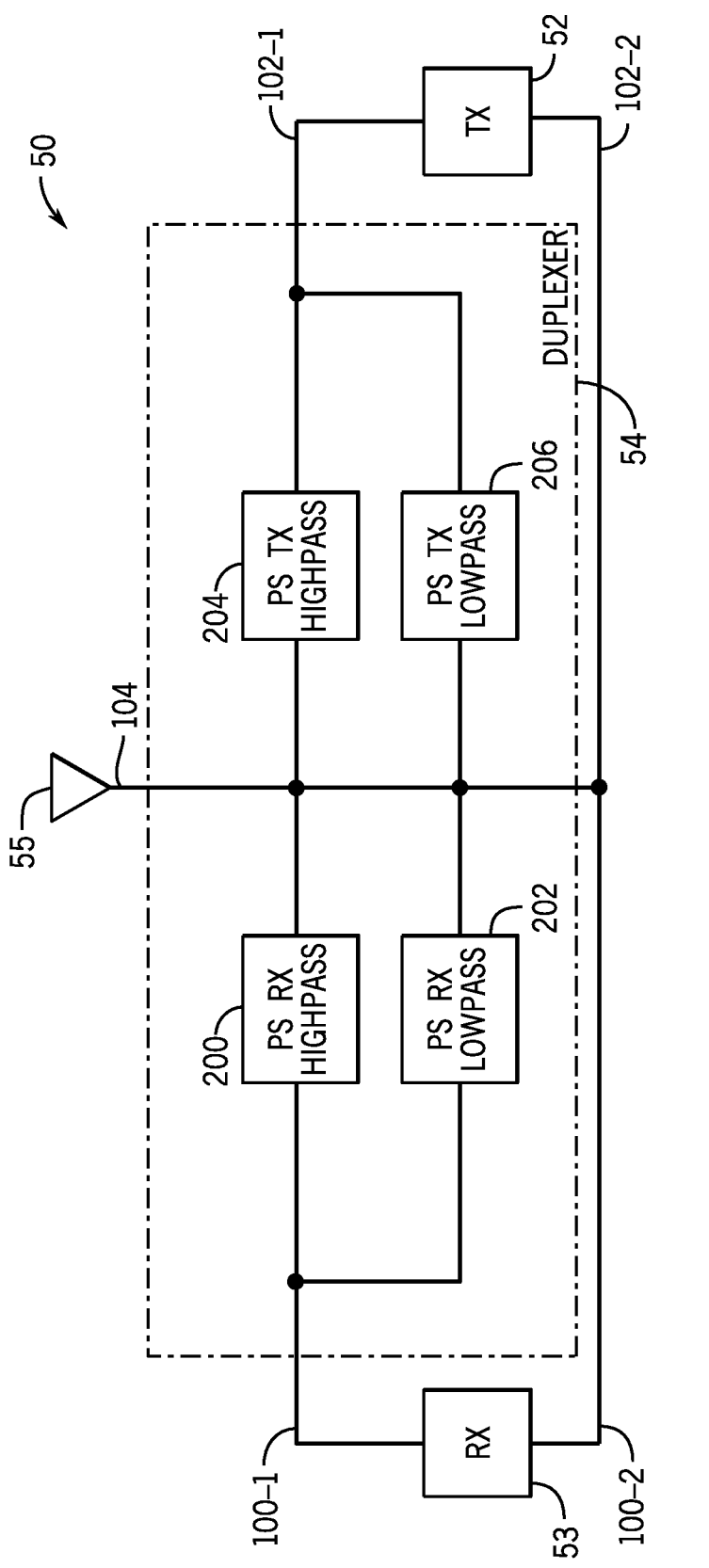
FIG. 14 is the circuit diagram of the RFFE of FIG. 6 where the duplexer includes a high-pass RX phase shifter, a low-pass RX phase shifter, a high-pass TX phase shifter, and a low-pass TX phase shifter, according to embodiments of the present disclosure.

FIG. 14 is the circuit diagram of the RFFE 50 where the duplexer 54 includes a high-pass RX phase shifter 200, a low-pass RX phase shifter 202, a high-pass TX phase shifter 204, and a low-pass TX phase shifter 206. The high-pass RX phase shifter 200 may include circuitry to shift a phase of input signals having a frequency above a threshold (e.g., 1 GHz, 5 GHz, 24 GHz, 40 GHz, and so on). For example, in some cases, the receive frequency range may be above the threshold. In such cases, the high-pass RX phase shifter 200 may shift a phase of input signals having a frequency within the receive frequency range.

The low-pass RX phase shifter 202 may include circuitry to shift a phase of input signals having a frequency below the threshold. In different embodiments, the high-pass RX phase shifter 200 and the low-pass RX phase shifter 202 may have similar or different thresholds. In any case, in some cases, the receive frequency range may be below the threshold. Accordingly, the low-pass RX phase shifter 202 may shift a phase of input signals having a frequency within the receive frequency range.

The high-pass RX phase shifter 200 may include circuitry to shift a phase of input signals having a frequency above a threshold (e.g., 1 GHz, 5 GHz, 24 GHz, 40 GHz, and so on). For example, in some cases, the transmit frequency range may be above the threshold. In such cases, the high-pass TX phase shifter 204 may shift a phase of input signals having a frequency within the transmit frequency range.

Moreover, the low-pass TX phase shifter 206 may include circuitry to shift a phase of input signals having a frequency below the threshold. In different embodiments, the high-pass TX phase shifter 204 and the low-pass TX phase shifter 206 may have similar or different thresholds. In any case, in some cases, the transmit frequency range may be below the threshold. Accordingly, the low-pass TX phase shifter 206 may shift a phase of input signals having a frequency within the transmit frequency range.

In some embodiments, the receive frequency range is above the transmit frequency range. In such embodiments, the duplexer 54 may use the high-pass RX phase shifter 200 and the high-pass TX phase shifter 204 to provide the RX signals to the receiver 53, provide the TX signals to the antennas 55, and cancel (or reduce an amplitude of) leakage RX signals and leakage TX signals. In alternative or additional embodiments, the receive frequency range is below the transmit frequency range. In such embodiments, the duplexer 54 may use the low-pass RX phase shifter 202 and the low-pass TX phase shifter 206 to provide the RX signals to the receiver 53, provide the TX signals to the antennas 55, and cancel (or reduce an amplitude of) leakage RX signals and leakage TX signals.

With the foregoing in mind, in some embodiments, one or more of the high-pass RX phase shifter 200, the low-pass RX phase shifter 202, the high-pass TX phase shifter 204, and the low-pass TX phase shifter 206 may include a switch to couple the respective circuitry to or uncouple the respective circuitry from the remaining circuitry of the duplexer 54. In such embodiments, the processor 12 may provide one or more control signals to the duplexer 54 (e.g., the switches) to couple or uncouple the high-pass RX phase shifter 200, the low-pass RX phase shifter 202, the high-pass TX phase shifter 204, and the low-pass TX phase shifter 206. Accordingly, the duplexer 54 may selectively communicate RX and TX signals at multiple respective frequency ranges.

Figure 15:
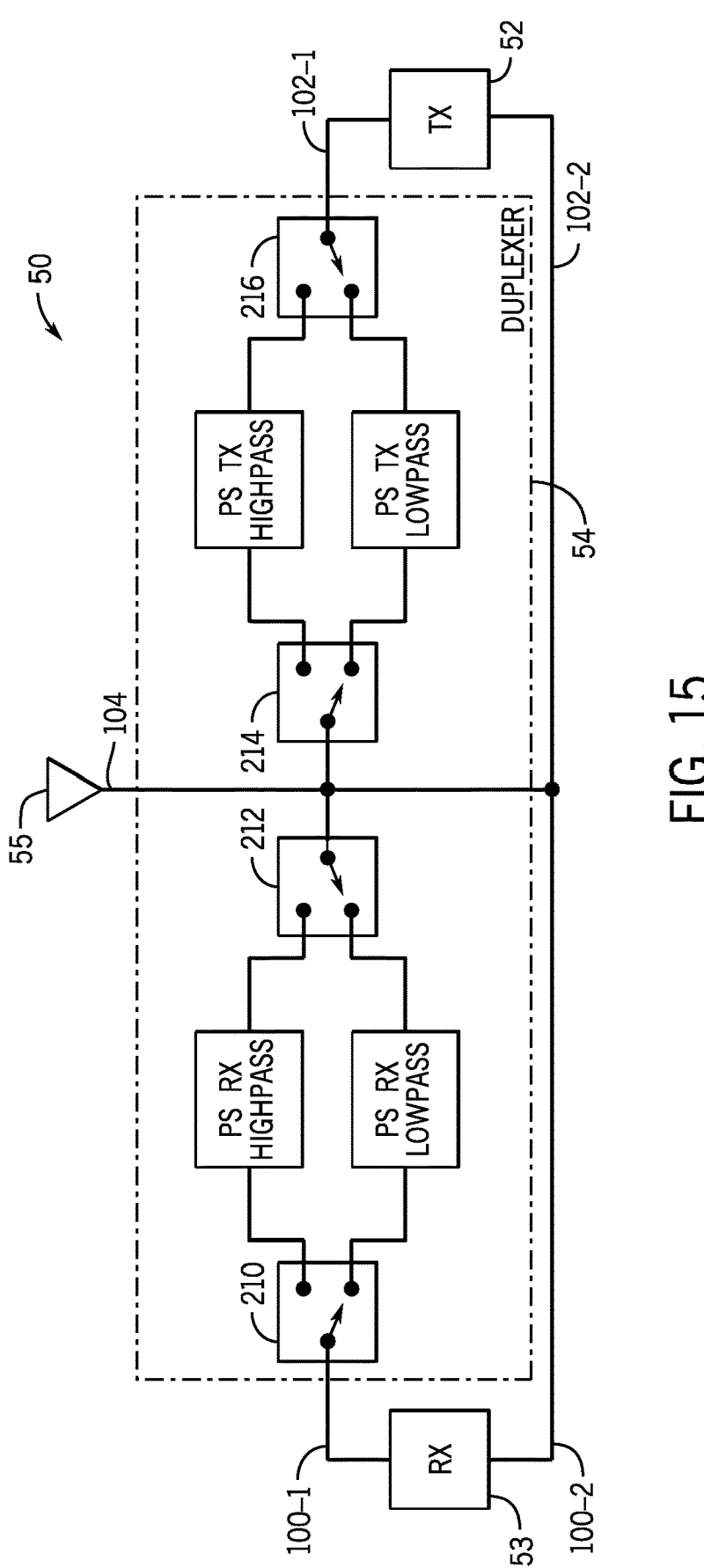
FIG. 15 is the circuit diagram of the RFFE of FIG. 6 including multiple switches coupled to a high-pass RX phase shifter, a low-pass RX phase shifter, a high-pass TX phase shifter, and a low-pass TX phase shifter, according to embodiments of the present disclosure.

FIG. 15 is the circuit diagram of the RFFE 50 including switches 210, 212, 214, and 216 coupled to the high-pass RX phase shifter 200, the low-pass RX phase shifter 202, the high-pass TX phase shifter 204, and the low-pass TX phase shifter 206. For example, the high-pass RX phase shifter 200, the low-pass RX phase shifter 202, the high-pass TX phase shifter 204, and the low-pass TX phase shifter 206 may couple to the duplexer 54 circuitry upon receiving one or more control signals from the processor 12. In the depicted embodiment, when the receive frequency range is above the transmit frequency range, the switches 210, 212, 214, and 216 may receive a first one or more control signals from the processor 12. The switches 210, 212, 214, and 216 may couple the high-pass RX phase shifter 200 and the high-pass TX phase shifter 204 and/or uncouple the low-pass RX phase shifter 202 and the low-pass TX phase shifter 206. Accordingly, the duplexer 54 may provide the RX signals to the receiver 53, provide the TX signals to the antennas 55, and cancel (or reduce an amplitude of) leakage RX signals and leakage TX signals based on the first one or more control signals.

Moreover, when the receive frequency range is below the transmit frequency range, the switches 210, 212, 214, and 216 may receive a second one or more control signals from the processor 12. The switches 210, 212, 214, and 216 may couple the low-pass RX phase shifter 202 and the low-pass TX phase shifter 206 and/or uncouple the high-pass RX phase shifter 200 and the high-pass TX phase shifter 204. Accordingly, the duplexer 54 may provide the RX signals to the receiver 53, provide the TX signals to the antennas 55, and cancel (or reduce an amplitude of) leakage RX signals and leakage TX signals based on the first one or more control signals. Similarly, the duplexer 54 may selectively communicate RX and TX signals at multiple respective frequency ranges.

Figure 16:
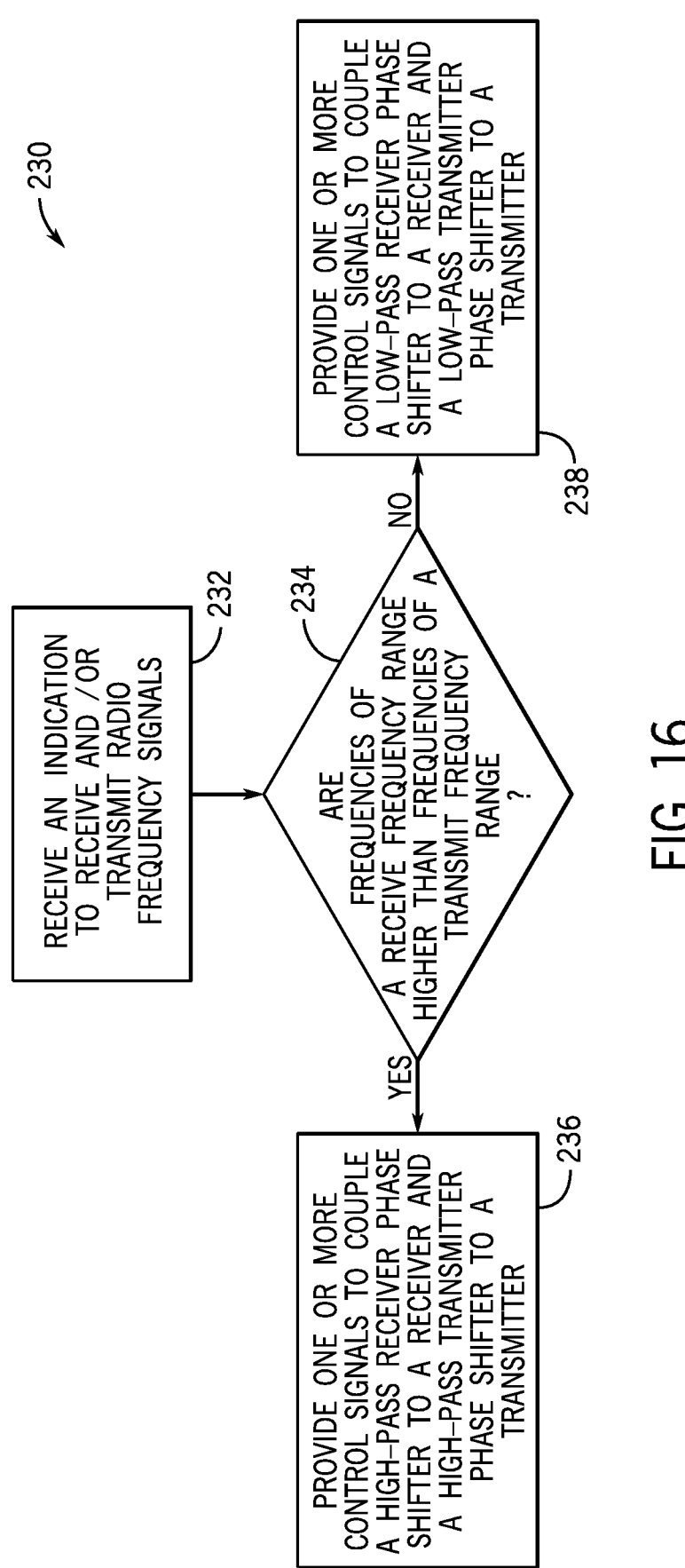
FIG. 16 is a process for selectively communicating RX and TX signals at multiple respective frequency ranges using the duplexer of FIGS. 14 and/or 15, according to embodiments of the present disclosure.

FIG. 16 is a process 230 for selectively communicating RX and TX signals at multiple respective frequency ranges using the duplexer 54 of FIGS. 14 and/or 15 described above. In some embodiments, the processor 12 may perform the process 230. In alternative or additional embodiments, other viable circuitry may also perform the process 230. Moreover, it should be appreciated that although some process blocks are described herein, the processor 12 may also perform alternative or additional processes. Moreover, the processor 12 may perform the processes in any viable order.

By the way of example, at block 232, the processor 12 may receive an indication to communicate RX signals and/or TX signals. In some embodiments, the indication may include a user input, a signal provided by a base station, among other thing. In any case, at block 234, the processor 12 may determine whether a receive frequency range of the RX signals is higher than the transmit frequency range of the TX signals. At block 236, when the receive frequency range is above the transmit frequency range, the processor 12 may provide one or more control signals to couple the high-pass RX phase shifter 200 to the receiver 53 and the high-pass TX phase shifter 204 to the transmitter 52. In some cases, the processor 12 may provide the one or more control signals to the switches 210 and 212 to couple the high-pass RX phase shifter 200 to (and/or uncouple the low-pass RX phase shifter 202 from) the receiver 53 and to the switches 214 and 216 to couple the high-pass TX phase shifter 204 to (and/or uncouple the low-pass TX phase shifter 206 from) the transmitter 52.

Alternatively, at block 238, when the receive frequency range is below the transmit frequency range, the processor 12 may provide one or more control signals to couple the low-pass RX phase shifter 202 to the receiver 53 and the low-pass TX phase shifter 206 to the transmitter 52. In some cases, the processor 12 may provide the one or more control signals to the switches X1 and X2 to couple the low-pass RX phase shifter 202 to (and/or uncouple the high-pass RX phase shifter 200 from) the receiver 53 and to the switches X3 and X4 to couple the low-pass TX phase shifter 206 to (and/or uncouple the high-pass TX phase shifter 204 from) the transmitter 52. In alternative or additional cases, the processor 12 may provide the one or more control signals to switches of the embodiments of FIG. 14 that are positioned inside the high-pass RX phase shifter 200, the low-pass RX phase shifter 202, the high-pass TX phase shifter 204, and/or the low-pass TX phase shifter 206. Accordingly, the receiver 53 may receive RX signals (e.g., the RX signals 132 discussed above) and/or the transmitter TX may transmit TX signals (e.g., the TX signals 140 discussed above) with reduced RX leakage signal and/or TX leakage signal to provide improved isolation between the receiver 53 and the transmitter 52.

With the foregoing in mind, in some embodiments, a radio frequency front end (RFFE) circuit is described. The RFFE circuit may include a first phase shifter coupled to a first node, a second phase shifter coupled to the first node and a second node, a third phase shifter coupled to the second node, a switch coupled to the first node, the second node, and one or more antennas, a receiver differentially coupled to the first phase shifter and the one or more antennas, and a transmitter differentially coupled to the third phase shifter and the one or more antennas. The switch may couple the one or more antennas to one of the first node and the second node.

The switch may receive first one or more control signals to couple the one or more antennas to the first node and receive second one or more control signals to couple the one or more antennas to the second node.

The receiver, the one or more antennas, or both may receive one or more radio frequency (RF) signals having a frequency within a first frequency range when the switch is coupling the one or more antennas to the first node and receive one or more RF signals having a frequency within a second frequency range higher than the first frequency range when the switch is coupling the one or more antennas to the second node.

The transmitter may provide one or more RF signals having a frequency within a first frequency range for transmission via the one or more antennas when the switch is coupling the one or more antennas to the first node and may provide one or more RF signals having a frequency within a second frequency range lower than the first frequency range for transmission via the one or more antennas when the switch is coupling the one or more antennas to the second node.

At least one of the first phase shifter, the second phase shifter, and the third phase shifter may provide a first respective phase shift to input signals having a frequency within a first frequency range and provide a second respective phase shift to input signals having a frequency within a second frequency range.

When the switch is coupling the one or more antennas to the first node, the first phase shifter may shift a phase of input signals having a frequency within a first frequency range, the first frequency range being associated with a reception frequency of the one or more antennas, and pass-through input signals having a frequency within a second frequency range, the second frequency range being associated with a transmission frequency of the one or more antennas.

When the switch is coupling the one or more antennas to the second node, the first phase shifter and the second phase shifter may shift a phase of input signals having a frequency within a first frequency range, the first frequency range being associated with a reception frequency of the one or more antennas, and pass-through input signals having a frequency within a second frequency range, the second frequency range being associated with a transmission frequency of the one or more antennas.

When the switch is coupling the one or more antennas to the first node, the second phase shifter and the third phase shifter may shift a phase of input signals having a frequency within a first frequency range, the first frequency range being associated with a transmission frequency of the one or more antennas, and pass-through input signals having a frequency within a second frequency range, the second frequency range being associated with a reception frequency of the one or more antennas.

When the switch is coupling the one or more antennas to the second node, the third phase shifter may shift a phase of input signals having a frequency within a first frequency range, the first frequency range being associated with a transmission frequency of the one or more antennas, and pass-through input signals having a frequency within a second frequency range, the second frequency range being associated with a reception frequency of the one or more antennas.

The RFFE circuit may include a fourth phase shifter coupled to the second phase shifter and the second node.

In yet another embodiment, a RFFE circuit may include a receiver, a transmitter, a first high-pass phase shifter coupled to the receiver and a node, where the node may couple to one or more antennas. The RFFE circuit may also include a first low-pass phase shifter coupled to the receiver and the node, the receiver being differentially coupled to the first high-pass phase shifter and the first low-pass phase shifter on a first side and to the node on a second side. The RFFE circuit may also include a second high-pass phase shifter coupled to the transmitter and the node, the transmitter being differentially coupled to the second high-pass phase shifter on a first side and to the node on a second side.

The first high-pass phase shifter and the first low-pass phase shifter may each comprise a respective switch, the respective switches may receive one or more control signals to uncouple the first high-pass phase shifter or the first low-pass phase shifter from the receiver.

The RFFE circuit may include a first switch coupled to the receiver, the first high-pass phase shifter, and the first low-pass phase shifter, where the first switch may receive one or more control signals to couple the receiver to one of the first high-pass phase shifter and the first low-pass phase shifter.

The first high-pass phase shifter may shift a phase of one or more input signals having a first frequency above a first threshold and pass-through one or more input signals having a second frequency below a second threshold. The first low-pass phase shifter may shift a phase of one or more input signals having a third frequency below a third threshold and pass-through one or more input signals having a fourth frequency above a fourth threshold.

The second high-pass phase shifter may shift a phase of one or more input signals having a first frequency above a first threshold.

The RFFE circuit may include a second low-pass phase shifter coupled to the transmitter and the node, where the transmitter is being differentially coupled to the second high-pass phase shifter and the second low-pass phase shifter on a first side and to the node on a second side. The second low-pass phase shifter may shift a phase of one or more input signals having a first frequency above a first threshold and may pass-through one or more input signals having a second frequency below a second threshold.

In yet another embodiment, a RFFE circuit may include splitter/combiner circuitry that may couple to one or more antennas, a first phase shifter coupled to the splitter/combiner circuitry, a receiver differentially coupled to the first phase shifter and the splitter/combiner circuitry, a second phase shifter coupled to the splitter/combiner circuitry, and a transmitter differentially coupled to the second phase shifter and the splitter/combiner circuitry. The splitter/combiner circuitry may provide a first impedance to the one or more antennas, the first phase shifter, the second phase shifter, the receiver, and the transmitter.

The first impedance may include an input impedance and an output impedance.

Providing the first impedance may include providing complex conjugate impedance of the one or more antennas, the first phase shifter, the second phase shifter, the receiver, the transmitter, or a combination thereof.

The splitter/combiner circuitry may include a 1:4 Wilkinson splitter/combiner circuitry.

Alternatively, the splitter/combiner circuitry may include a 1:2 Wilkinson splitter/combiner circuit configured to be coupled to one or more antennas, the 1:2 Wilkinson splitter/combiner circuit being coupled to the first phase shifter and the second phase shifter, and a 1:3 Wilkinson splitter/combiner circuit being coupled to the receiver, the transmitter, and the 1:2 Wilkinson splitter/combiner circuit.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A radio frequency front end (RFFE) circuit, comprising:
a first phase shifter coupled to one or more antennas and configured to shift a phase of a receive signal within a receive frequency range received by the one or more antennas to generate a phase-shifted receive signal and pass-through a transmission signal within a transmission frequency range;
a second phase shifter coupled to the one or more antennas and configured to shift a phase of the transmission signal to generate a phase-shifted transmission signal and pass-through the receive signal;
a receiver differentially coupled to the first phase shifter and the one or more antennas and configured to receive the phase-shifted receive signal and the receive signal, the transmission signal and the phase-shifted transmission signal destructively combining at the receiver; and
a transmitter differentially coupled to the second phase shifter and the one or more antennas, the transmitter configured to output the transmission signal, the receive signal and the phase-shifted receive signal destructively combining at the transmitter.

2. The RFFE circuit of claim 1, comprising a first balun differentially coupling the receiver to the first phase shifter and the one or more antennas.

3. The RFFE circuit of claim 2, wherein the first balun is configured to constructively combine in-phase signals received from the first phase shifter and the one or more antennas.

4. The RFFE circuit of claim 2, wherein the first balun is configured to destructively combine out-of-phase signals received from the first phase shifter and the one or more antennas.

5. The RFFE circuit of claim 1, comprising a second balun differentially coupling the transmitter to the second phase shifter and the one or more antennas.

6. The RFFE circuit of claim 5, wherein the second balun is configured to provide in-phase signals to the second phase shifter and the one or more antennas based on receiving single-ended signals from the transmitter.

7. The RFFE circuit of claim 6, wherein the second balun is configured to destructively combine out-of-phase signals received from the second phase shifter and the one or more antennas.

8. The RFFE circuit of claim 1, comprising a first impedance tuner coupled to the first phase shifter and the one or more antennas, the first impedance tuner configured to provide a first impedance higher than a first threshold impedance to input signals having a frequency within the receive frequency range and provide a second impedance lower than a second threshold impedance to input signals having a frequency within the transmission frequency range.

9. The RFFE circuit of claim 8, comprising a second impedance tuner coupled to the second phase shifter and the one or more antennas, the second impedance tuner configured to provide a third impedance higher than a third threshold impedance to input signals having a frequency within the transmission frequency range and provide a fourth impedance lower than a fourth threshold impedance to input signals having a frequency within the receive frequency range.

10. A duplexer, comprising:
a receiver phase shifter having a first terminal coupled to differential receiver circuitry and a second terminal coupled to the differential receiver circuitry and an antenna, the receiver phase shifter configured to shift a phase of a receive signal within a receive frequency range received by the antenna to generate a phase-shifted receive signal and pass-through a transmission signal within a transmission frequency range, the differential receiver circuitry configured to receive the phase-shifted receive signal and the receive signal; and
a transmitter phase shifter having a first terminal coupled to differential transmitter circuitry and a second terminal coupled to the differential transmitter circuitry and the antenna, the transmitter phase shifter configured to shift a phase of the transmission signal to generate a phase-shifted transmission signal and pass-through the receive signal, the differential transmitter circuitry configured to output the transmission signal, the receive signal and the phase-shifted receive signal destructively combining at the differential transmitter circuitry, and the transmission signal and the phase-shifted transmission signal destructively combining at the differential receiver circuitry.

11. The duplexer of claim 10, wherein the receiver phase shifter is configured to
provide differential signals having a frequency within the receive frequency range, and
provide two in-phase signals having a frequency within the transmission frequency range.

12. The duplexer of claim 10, wherein the transmitter phase shifter is configured to
provide differential signals having a frequency within the transmission frequency range, and
provide two in-phase signals having a frequency within the receive frequency range.

13. The duplexer of claim 10, comprising a receiver impedance tuner coupled to the receiver phase shifter and the antenna.

14. The duplexer of claim 13, comprising a transmitter impedance tuner coupled to the transmitter phase shifter and the antenna.

15. The duplexer of claim 14, wherein the receiver impedance tuner is configured to provide a first impedance higher than a first threshold to the phase-shifted receive signal and provide a second impedance lower than a second threshold to the transmission signal.

16. The duplexer of claim 15, wherein the transmitter impedance tuner is configured to provide a third impedance higher than the first threshold to the transmission signal and provide a fourth impedance lower than the second threshold to the phase-shifted receive signal.

17. An electronic device, comprising:
   a radio frequency (RF) receiver;
   a first balun coupled to the RF receiver;
   an RF transmitter;
   a second balun coupled to the RF transmitter; and
   a duplexer coupled to one or more antennas, the duplexer being differentially coupled to the RF receiver via the first balun and differentially coupled to the RF transmitter via the second balun, the duplexer comprising
      a first phase shifter configured to shift a phase of a receive signal within a receive frequency range to generate a phase-shifted receive signal and pass-through a transmission signal within a transmission frequency range, the RF receiver configured to receive the phase-shifted receive signal and the receive signal, and a second phase shifter configured to shift a phase of the transmission signal to generate a phase-shifted transmission signal and pass-through the receive signal, the RF transmitter configured to output the transmission signal, the receive signal and the phase-shifted receive signal destructively combining at the RF transmitter, and the transmission signal and the phase-shifted transmission signal destructively combining at the RF receiver.

18. The electronic device of claim 17, wherein the second balun is configured to destructively combine out-of-phase signals received from the duplexer.

19. The electronic device of claim 17, wherein the first balun is configured to
   constructively combine in-phase signals received from the duplexer, and
   destructively combine out-of-phase signals received from the duplexer.

20. The electronic device of claim 17, wherein the second balun is configured to
   provide two in-phase signals to the duplexer based on receiving a single-ended signal from the RF transmitter.

* * * * *